(12) United States Patent
Larsen et al.

(10) Patent No.: US 11,355,607 B2
(45) Date of Patent: Jun. 7, 2022

(54) SEMICONDUCTOR DEVICE STRUCTURES WITH LINERS

(71) Applicant: Micron Technology, Inc., Boise, ID (US)

(72) Inventors: Christopher J. Larsen, Boise, ID (US); David A. Daycock, Boise, ID (US); Kunal Shrotri, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 221 days.

(21) Appl. No.: 14/875,493

(22) Filed: Oct. 5, 2015

(65) Prior Publication Data

US 2016/0027882 A1    Jan. 28, 2016

Related U.S. Application Data

(62) Division of application No. 13/921,509, filed on Jun. 19, 2013, now Pat. No. 9,153,455.

(51) Int. Cl.
*H01L 27/11521* (2017.01)
*H01L 29/788* (2006.01)
(Continued)

(52) U.S. Cl.
CPC .... *H01L 29/42324* (2013.01); *H01L 21/3085* (2013.01); *H01L 21/3086* (2013.01);
(Continued)

(58) Field of Classification Search
CPC ............ H01L 27/115; H01L 27/11521; H01L 21/28273; H01L 29/42324;
(Continued)

(56) References Cited

U.S. PATENT DOCUMENTS

| | | | |
|---|---|---|---|
| 6,348,380 B1 | 2/2002 | Weimer et al. | |
| 6,624,024 B1 * | 9/2003 | Prall | H01L 21/76895 |
| | | | 257/E21.507 |

(Continued)

FOREIGN PATENT DOCUMENTS

| | | | |
|---|---|---|---|
| JP | 2005079255 A | * | 3/2005 |
| JP | 2009117779 A | | 5/2009 |
| WO | 2011160001 A1 | | 12/2011 |

OTHER PUBLICATIONS

Kuppurao et al., In Situ Steam Generation: A New Rapid Thermal Oxidation Technique, Solid State Technology, vol. 43, Issue 7, Jul. 2000, 7 pages.

*Primary Examiner* — Kenneth Parker
*Assistant Examiner* — Long H Le
(74) *Attorney, Agent, or Firm* — TraskBritt (57) ABSTRACT

Methods of forming semiconductor devices, memory cells, and arrays of memory cells include forming a liner on a conductive material and exposing the liner to a radical oxidation process to densify the liner. The densified liner may protect the conductive material from substantial degradation or damage during a subsequent patterning process. A semiconductor device structure, according to embodiments of the disclosure, includes features extending from a substrate and spaced by a trench exposing a portion of a substrate. A liner is disposed on sidewalls of a region of at least one conductive material in each feature. A semiconductor device, according to embodiments of the disclosure, includes memory cells, each comprising a control gate region and a capping region with substantially aligning sidewalls and a charge structure under the control gate region.

19 Claims, 4 Drawing Sheets

(51) Int. Cl.
  *H01L 29/423*    (2006.01)
  *H01L 21/308*    (2006.01)
  *H01L 27/11517*  (2017.01)
  *H01L 21/28*     (2006.01)
  *H01L 21/3213*   (2006.01)
  *H01L 27/11558*  (2017.01)
  *H01L 29/06*     (2006.01)
  *H01L 21/02*     (2006.01)

(52) U.S. Cl.
  CPC .. *H01L 21/32139* (2013.01); *H01L 27/11517* (2013.01); *H01L 27/11521* (2013.01); *H01L 27/11558* (2013.01); *H01L 29/0649* (2013.01); *H01L 29/40114* (2019.08); *H01L 29/788* (2013.01); *H01L 21/0228* (2013.01); *H01L 21/02164* (2013.01); *H01L 21/02337* (2013.01)

(58) Field of Classification Search
  CPC ........... H01L 29/66825; H01L 21/3085; H01L 21/3086; H01L 27/11517; H01L 27/11558; H01L 29/0649; H01L 29/78
  See application file for complete search history.

(56) References Cited

U.S. PATENT DOCUMENTS

| | | | |
|---|---|---|---|
| 6,756,631 B2 | 6/2004 | Wu | |
| 7,375,004 B2 | 5/2008 | Sandhu et al. | |
| 7,425,742 B2 | 9/2008 | Nazarian | |
| 7,442,620 B2 | 10/2008 | Wu et al. | |
| 7,741,183 B2 | 6/2010 | Luo et al. | |
| 7,999,328 B2 | 8/2011 | Sandhu et al. | |
| 8,030,170 B2 | 10/2011 | Ho et al. | |
| 8,105,956 B2 | 1/2012 | Ho et al. | |
| 8,216,935 B2 | 7/2012 | Blomiley et al. | |
| 8,288,811 B2 | 10/2012 | Ramaswamy et al. | |
| 2004/0046206 A1* | 3/2004 | Yun | H01L 21/28273 257/315 |
| 2004/0094794 A1* | 5/2004 | Wu | H01L 27/115 257/316 |
| 2004/0104421 A1 | 6/2004 | Ozawa et al. | |
| 2004/0178470 A1 | 9/2004 | Hieda | |
| 2005/0056823 A1* | 3/2005 | Allen | H01L 21/31116 257/1 |
| 2005/0233514 A1* | 10/2005 | Bu | H01L 21/76828 438/199 |
| 2006/0001073 A1* | 1/2006 | Chen | H01L 21/7682 257/314 |
| 2006/0040447 A1 | 2/2006 | Violette et al. | |
| 2007/0111449 A1 | 5/2007 | Yu et al. | |
| 2008/0157181 A1* | 7/2008 | Kim | H01L 21/28273 257/321 |
| 2008/0169496 A1* | 7/2008 | Keller | H01L 21/31122 257/314 |
| 2008/0179715 A1 | 7/2008 | Coppa | |
| 2008/0203466 A1 | 8/2008 | Sakai et al. | |
| 2009/0023279 A1* | 1/2009 | Kim | H01L 21/764 438/594 |
| 2009/0042383 A1* | 2/2009 | Kim | H01L 21/02211 438/619 |
| 2009/0045453 A1* | 2/2009 | Heo | H01L 21/28273 257/324 |
| 2010/0171180 A1* | 7/2010 | Zhang | H01L 21/823807 257/369 |
| 2011/0309426 A1* | 12/2011 | Purayath | H01L 21/28273 257/316 |
| 2011/0318914 A1* | 12/2011 | Choi | H01L 21/7682 438/587 |
| 2012/0001264 A1* | 1/2012 | Kim | C09K 13/04 257/368 |
| 2012/0261736 A1* | 10/2012 | Hsu | H01L 29/66825 257/315 |
| 2012/0289034 A1 | 11/2012 | Tang | |
| 2013/0001673 A1 | 1/2013 | Ramaswamy et al. | |
| 2013/0264628 A1* | 10/2013 | Koval | H01L 21/30604 257/316 |
| 2013/0264649 A1* | 10/2013 | Sim | H01L 29/66825 257/365 |
| 2014/0021485 A1 | 1/2014 | Cho | |
| 2014/0264495 A1* | 9/2014 | Hsu | H01L 29/401 257/288 |
| 2014/0353795 A1* | 12/2014 | Tong | H01L 21/76224 257/506 |
| 2014/0374811 A1 | 12/2014 | Larsen et al. | |

* cited by examiner

SEMICONDUCTOR DEVICE STRUCTURES WITH LINERS

CROSS-REFERENCE TO RELATED APPLICATION

This application is a divisional of U.S. patent application Ser. No. 13/921,509, filed Jun. 19, 2013, now U.S. Pat. No. 9,153,455, issued Oct. 6, 2015, the disclosure of which is hereby incorporated in its entirety herein by this reference.

TECHNICAL FIELD

The present disclosure, in various embodiments, relates generally to semiconductor device design and fabrication. More particularly, this disclosure relates to semiconductor fabrication methods involving forming a conductive region and then subsequently patterning other regions.

BACKGROUND

Flash memory is a common type of non-volatile memory. Flash memory cells may include a source region and a drain region that is spaced apart from the source region by an intermediate channel region. A memory cell, including a charge structure (e.g., a floating gate, a charge trap, or other similar structure), is disposed over the channel region and is electrically isolated from the other elements by a dielectric material, such as an oxide. For example, a tunnel dielectric material (which may also be referred to in the art as a "gate dielectric" material) may be disposed between the charge structure and the channel region. A control gate, of the memory cell, is located over the charge structure. The control gate may be electrically separated from the charge structure by a charge block region, such as another dielectric layer that may be referred to in the art as an "inter-poly dielectric" (IPD), an "intergate insulator," or an "intergate dielectric." Thus, the charge structure may be configured as a floating gate that is electrically "floating" so that it is insulated from both the channel and the control gate.

Fabricating memory cells often involves patterning a conductive material of the control gate region before patterning a conductive material of the charge structure region. After patterning the control gate region, but before patterning the charge structure region, a liner may be formed on the conductive material of the control gate region to provide protection to the conductive material during the latter (i.e., "subsequent") patterning process in which the conductive material of the charge structure region is patterned. Nonetheless, conventional liners may not survive the subsequent patterning process and, as such, may leave at least partially exposed the conductive material of the control gate region. The exposure may result in damage to the conductive material of the control gate region. The damage may be in the form of any one of roughened sidewalls, undercuts at interfaces with neighboring regions, and decreased widths relative to the initially-patterned control gate region. This damage may result in degraded performance (e.g., increased resistance and capacitance) of the resulting memory cell. Thus, fabricating memory devices, including flash memory devices, without degradation to performance is often a challenge.

DETAILED DESCRIPTION

Methods of forming a semiconductor device structure, methods of forming memory cells, and methods of forming an array of memory cells are disclosed. Related semiconductor device structures and semiconductor devices are also disclosed. The methods include forming a liner over otherwise exposed surfaces of a conductive material and subjecting the liner to a radical oxidation treatment to densify the liner. The densified liner provides protection to the conductive material during subsequent processing acts, such as patterning processes. For example, the densified liner may at least partially survive subsequent etching processes such that the conductive material may remain covered by the densified liner during the subsequent etching processes. Therefore, regions of conductive material may be formed with less damage and degradation and with no or less metallic contamination, following subsequent patterning processes, compared to conductive materials of conventional semiconductor structures formed utilizing the same subsequent patterning processes.

As used herein, the term "radical oxidation" refers to a process in which a semiconductor structure is subjected to heat in the presence of radicals, such as oxygen radicals. For example, and without limitation, radical oxidation includes in situ steam generation (ISSG).

As used herein, the term "liner" refers to a material substantially conformally formed on at least one surface of another material. For example, and without limitation, a "liner" may be substantially conformally formed on all exposed surfaces of materials of a semiconductor structure.

As used herein, the term "densified liner" refers to a material derived from a liner and having a greater amount of mass per volume unit compared to the initial material of the liner.

As used herein, the term "substrate" means and includes a base material or construction upon which components, such as those within memory cells as well as other semiconductor device structures, are formed. The substrate may be a semiconductor substrate, a base semiconductor material on a supporting structure, a metal electrode, or a semiconductor substrate having one or more materials, structures, or regions formed thereon. The substrate may be a conventional silicon substrate or other bulk substrate including a semiconductive material. As used herein, the term "bulk substrate" means and includes not only silicon wafers, but also silicon-on-insulator ("SOI") substrates, such as silicon-on-sapphire ("SOS") substrates or silicon-on-glass ("SOG") substrates, epitaxial layers of silicon on a base semiconductor foundation, or other semiconductor or optoelectronic materials, such as silicon-germanium ($Si_{1-x}Ge_x$, where x is, for example, a mole fraction between 0.2 and 0.8), germanium (Ge), gallium arsenide (GaAs), gallium nitride (GaN), or indium phosphide (InP), among others. Furthermore, when reference is made to a "substrate" in the following description, previous process stages may have been utilized to form materials, regions, or junctions in or on the base semiconductor structure or foundation.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (rotated ninety degrees, inverted, etc.) and the spatially relative descriptors used herein interpreted accordingly.

As used herein, reference to an element as being "on" or "over" another element means and includes the element being directly on top of, adjacent to, underneath, or in direct contact with the other element. It also includes the element being indirectly on top of, adjacent to, underneath, or near the other element, with other elements present therebetween. In contrast, when an element is referred to as being "directly on" another element, there are no intervening elements present.

As used herein, the terms "comprises," "comprising," "includes," and/or "including" specify the presence of stated features, structures, regions, stages, operations, elements, materials, components, and/or groups, but do not preclude the presence or addition of one or more other features, structures, regions, stages, operations, elements, materials, components, and/or groups thereof.

As used herein, the term "and/or" includes any and all combinations of one or more of the associated listed items.

As used herein, the singular forms "a," "an," and "the" are intended to include the plural forms as well, unless the context clearly indicates otherwise.

The illustrations presented herein are not meant to be actual views of any particular material, feature, structure, region, or method stage, but are merely idealized representations that are employed to describe embodiments of the present disclosure.

Embodiments are described herein with reference to the accompanying drawing figures. Variations from the shapes of the structures depicted in the figures as a result, for example, of manufacturing techniques and/or tolerances, are to be expected. Thus, embodiments described herein are not to be construed as being limited to the particular shapes or regions as illustrated but include deviations in shapes that result, for example, from manufacturing. For example, a region illustrated or described as box shaped may have rough and/or nonlinear structures. Moreover, sharp angles that are illustrated may be rounded. Thus, the regions illustrated in the figures are schematic in nature and their shapes are not intended to illustrate the precise shape of a region and do not limit the scope of the present claims.

The following description provides specific details, such as material types and processing conditions, in order to provide a thorough description of some embodiments of the disclosed devices and methods. However, a person of ordinary skill in the art will understand that the embodiments of the methods may be practiced without employing these specific details. Indeed, the embodiments of the methods may be practiced in conjunction with conventional semiconductor fabrication techniques employed in the industry.

The fabrication processes described herein do not form a complete process flow for processing semiconductor device structures. The remainder of the process flow is known to those of ordinary skill in the art. Accordingly, only the methods and structures necessary to understand embodiments of the present devices and methods are described herein.

Unless the context indicates otherwise, the materials described herein may be formed by any suitable technique including, but not limited to, spin coating, knife coating, dip coating, blanket coating, chemical vapor deposition ("CVD"), atomic layer deposition ("ALD"), plasma-enhanced ALD, and physical vapor deposition ("PVD"). Alternatively, the materials may be grown in situ. Depending on the specific material to be formed, the technique for depositing or growing the material may be selected by a person of ordinary skill in the art.

Unless the context indicates otherwise, the removal of materials described herein may be accomplished by any suitable technique including, but not limited to, etching, abrasive planarization, and other methods.

Reference will now be made to the drawings, where like numerals refer to like components throughout. The drawings are not necessarily drawn to scale.

Methods of forming semiconductor device structures, of forming memory cells, and of forming an array of memory cells are disclosed. The methods may form a semiconductor device structure having a conductive region formed and then protected by a densified liner during a subsequent patterning process.

The methods disclosed herein may be used to form at least one semiconductor device structure having a conductive region. As nonlimiting examples, the methods may be used to form conductive contacts, conductive interconnects, transistors, and memory devices, including, for example, dynamic random access memory (DRAM) cells and flash memory (e.g., to be included in a flash memory array with NAND, NOR, AND, or other flash memory architecture).

Figure 1:
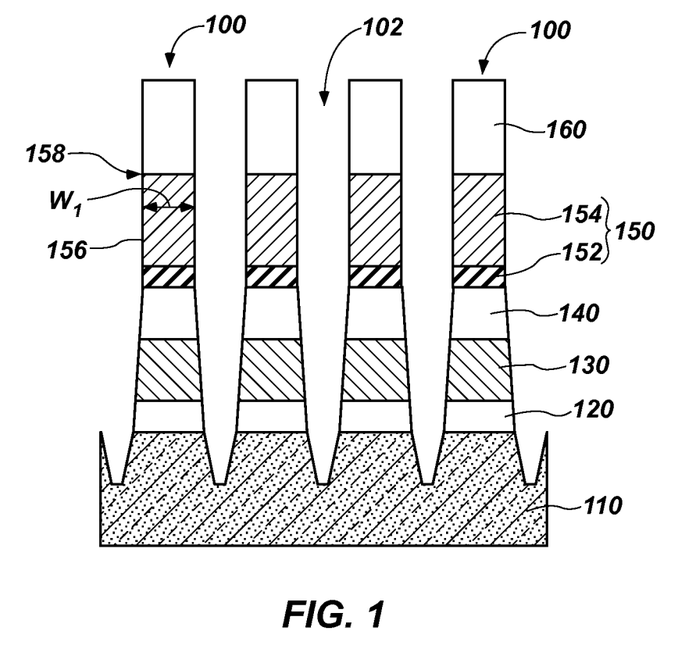
FIG. 1 is a cross-sectional, elevational, schematic illustration of memory cell structures, according to an embodiment of the present disclosure.

With reference to FIG. 1, methods of the present disclosure may be used to form memory cell structures 100. The memory cell structures 100 illustrated may not be final structures of a memory device, but a final memory device may incorporate such memory cell structures 100. For example, source and drain regions may be formed subsequent to forming the memory cell structures 100.

Each memory cell structure 100 may be in the form of a feature extending from a substrate 110 and spaced from another memory cell structure 100 feature by a trench 102. The substrate 110 may comprise, consist essentially of, or consist of silicon. In some embodiments, the substrate 110 may comprise monocrystalline silicon doped with a dopant (e.g., a p-type dopant). The substrate 110 may include any construction comprising semiconductive material, including, but not limited to, bulk semiconductive materials such as a semiconductive wafer (either alone or in assemblies comprising other materials thereon) and semiconductive material regions (either alone or in assemblies comprising other materials). The substrate 110 may be homogeneous or may comprise various integrated circuit structures incorporated therein.

Each memory cell structure 100 may include a tunnel dielectric region 120 formed over (e.g., on) the substrate 110. The tunnel dielectric region 120 may be formed from a dielectric material 122 (FIG. 2) that may comprise any suitable composition or combination of compositions. For example, and without limitation, the dielectric material 122 (FIG. 2) of the tunnel dielectric region 120 may, for example, comprise, consist essentially of, or consist of silicon dioxide. The tunnel dielectric region 120 may be formed as a single region of the dielectric material 122 (FIG. 2), as illustrated, or may comprise multiple regions of electrically-insulative material.

Each memory cell structure 100 may also include a charge structure 130, such as a floating gate, over the tunnel dielectric region 120. In other embodiments, the charge structure 130 may be configured as a charge trap or other similar structure, such as those that may use nanodots as part of a charge storage structure. The charge structure 130 may be formed from a conductive material 132 (FIG. 2) that may comprise any suitable composition or combination of compositions. For example, and without limitation, the conductive material 132 of the charge structure 130 may comprise, consist essentially of, or consist of one or more elemental metals (e.g., tungsten, titanium, cobalt), metal-containing compositions (e.g., metals, metal silicides, metal nitrides), and conductively-doped semiconductor materials (e.g., conductively-doped polysilicon). The charge structure 130 may be formed as a single region of the conductive material 132 (FIG. 2), as illustrated, or may comprise multiple electrically conductive regions.

Within each memory cell structure 100 may be a charge block region 140 that may be formed over the charge structure 130. In some embodiments, the charge block region 140 may be formed of a dielectric material 142 (FIG. 2), which may include any suitable composition or combination or compositions. For example, and without limitation, the dielectric material 142 (FIG. 2) of the charge block region 140 may comprise, consist essentially of, or consist of one or both of silicon dioxide and silicon nitride. As a more particular example, and without limitation, the charge block region 140 may comprise a region of silicon nitride between a pair of regions of silicon dioxide (which may be referred to in the art as an "ONO dielectric stack") or may comprise a high-k dielectric material such as aluminum oxide ($Al_2O_3$).

A control gate region 150 within each memory cell structure 100 may overlie the charge block region 140. The control gate region 150 may comprise any suitable composition or combination of compositions. For example, and without limitation, the control gate region 150 may comprise, consist essentially of, or consist of at least one conductive material, such as one or more elemental metals (e.g., tungsten, titanium, cobalt), metal-containing compositions (e.g., metal silicides, metal nitrides), and conductively-doped semiconductor materials (e.g., conductively-doped polysilicon). The control gate region 150 may be formed as a single, homogeneous region or, as illustrated in FIG. 1, as a region of multiple materials. For example, the control gate region 150 may include a region of a doped conductive material 152 (e.g., a conductively-doped polysilicon) and a region of a metallic material 154 (e.g., tungsten). The doped conductive material 152 may be disposed on the charge block region 140, and the metallic material 154 may be disposed on the doped conductive material 152. As used herein, the term "metallic material" means and includes a conductive material that comprises, consists essentially of, or consists of a metal (e.g., an elemental metal material).

A capping region 160 of each memory cell structure 100 may be disposed over the control gate region 150. The capping region 160 may be formed of an electrically insulating material, which may comprise any suitable composition or combination of compositions. For example, and without limitation, the capping region 160 may comprise, consist essentially of, or consist of one or more of silicon dioxide, silicon nitride, and silicon oxynitride. The capping region 160 may be formed as a single region, as illustrated, or may comprise multiple electrically-insulative regions and/or materials.

The memory cell structure 100 may be formed in a memory array, with a large number of the memory cell structures 100 arranged in row and column fashion. Individual memory cell structures 100 may be coupled to access lines (which may also be known in the art as "word lines"). In embodiments in which the memory array is a flash memory array with a NOR architecture, the individual memory cell structures 100 may also be directly coupled to digit lines (which may also be known in the art as "bit lines" or "sense lines"). In embodiments in which the memory array is a flash memory array with a NAND architecture, strings of serially coupled memory cell structures 100 may be coupled to digit lines (e.g., through a select gate device). The access lines and digit lines may be configured to enable writing to or reading from the memory cell structures 100.

According to embodiments of the present disclosure, and as discussed in more detail below, the memory cell structures 100 formed may include control gate regions 150 having metallic material 154 regions with sidewalls 156 that are substantially aligned with sidewalls of the overlying capping region 160 and the underlying doped conductive material 152. An interface 158 between the capping region 160 and the metallic material 154 of the control gate region 150 may extend substantially a width $W_1$ of the memory cell structure 100 without undercuts or other gaps between the metallic material 154 and the capping region 160.

The sidewalls 156 may be substantially smooth, i.e., substantially free from peaks and valleys. Such smooth sidewalls 156 may provide improved (e.g., lowered) capacitance between neighboring memory cell structures 100, relative to roughened sidewalls having peaks and valleys therein. Peaks and valleys on sidewalls may degrade (e.g., increase) the capacitance between neighboring memory cell structures 100, and degraded capacitance degrades the performance of the resulting semiconductor device. That is, increases in capacitance result in increases in the RC (resistive-capacitive) time constant of the circuit incorporating the memory cell structure 100. The RC time constant is equal to the product of the circuit's resistance and capacitance. Therefore, a higher capacitance between access lines (e.g., word lines) means a higher capacitance for the circuit and leads to a higher RC time constant. The lower the RC time constant of a circuit, the faster the circuit is able to operate. Thus, forming the metallic material 154 to have substantially smooth sidewalls 156 lowers the RC time constant for the resulting structure and improves the performance of the resulting structure.

Neighboring memory cell structures 100 may be spaced from one another by the trenches 102 in each of which a region of the substrate 110 is exposed. In subsequent patterning processing acts, the exposed regions of the substrate 110 may be formed into source and drain regions, and regions of the substrate 110 disposed vertically under the memory cell structures 100 may be configured as channel regions.

Accordingly, disclosed is a semiconductor device comprising a plurality of memory cells. At least one memory cell of the plurality comprises a control gate region comprising a metallic material. The at least one memory cell also comprises a capping region overlying the control gate region. Sidewalls of the control gate region substantially align with sidewalls of the capping region. A charge structure is disposed under the control gate region.

Figure 2:
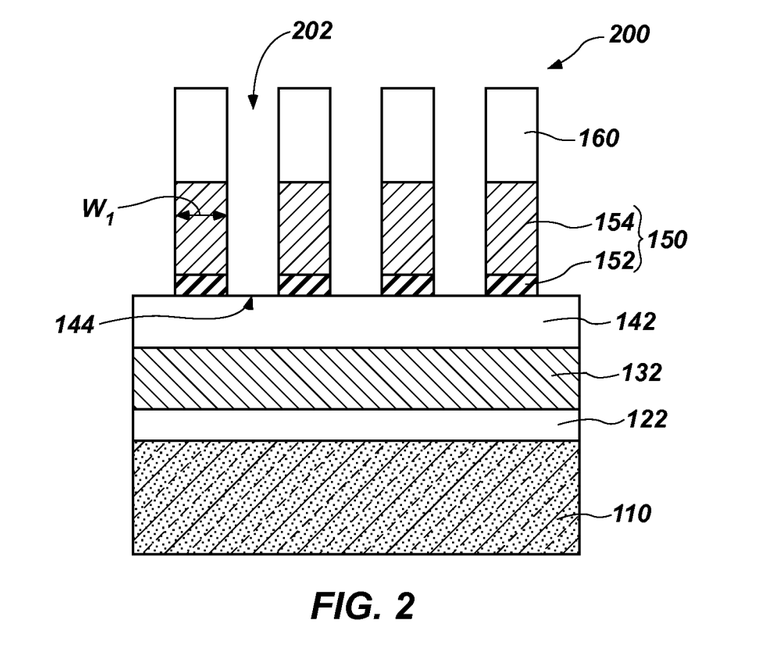
FIG. 2 is a cross-sectional, elevational, schematic illustration of memory cells during a stage of processing, wherein an intermediate structure has been patterned, according to an embodiment of the present disclosure.

With reference to FIG. 2, formation of the memory cell structures 100 (FIG. 1) may include formation of an intermediate structure 200 having patterned upper materials and not-yet-patterned lower materials. In some embodiments, the dielectric material 122 of the tunnel dielectric region 120 (FIG. 1), the conductive material 132 of the charge structure 130 (FIG. 1), the dielectric material 142 of the charge block region 140 (FIG. 1), the doped conductive material 152, the metallic material 154, and the material of the capping region 160 may be formed, sequentially, one over the other, to form a precursor structure. Each of the materials may be formed by a conventional technique, which is not described in detail herein. The precursor structure may be patterned (e.g., masked and etched) by conventional techniques to form the intermediate structure 200 with the formed capping region 160 and control gate region 150. In the intermediate structure 200, the control gate region 150 of one memory cell structure 100 (FIG. 1) to be formed is spaced from a neighboring control gate region 150 of another memory cell structure 100 (FIG. 1) to be formed by a space 202 (e.g., an opening) exposing a portion of a surface 144 of the dielectric material 142.

Figure 3:
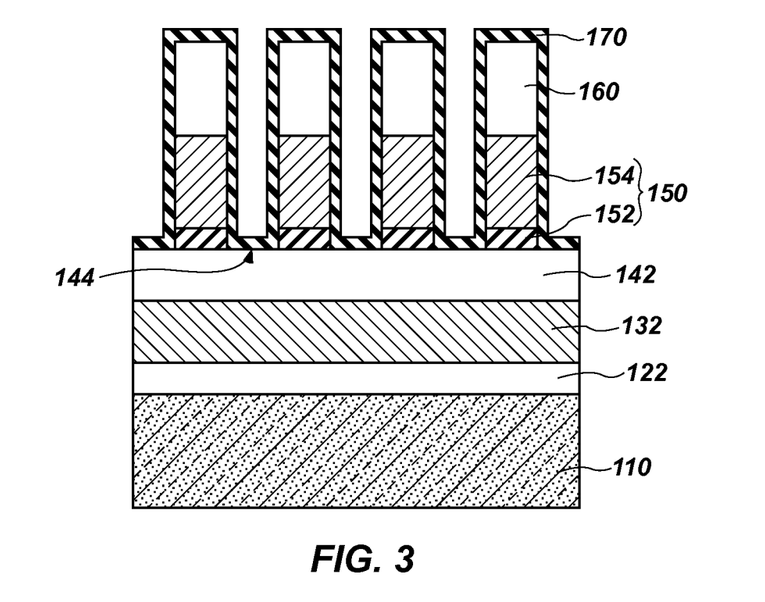
FIG. 3 is a cross-sectional, elevational, schematic illustration of memory cells during a stage of processing, wherein a liner has been formed over the intermediate structure of FIG. 2.

With reference to FIG. 3, a liner 170 may be formed over exposed surfaces of the intermediate structure 200 (FIG. 2). For example, and without limitation, the liner 170 may be substantially conformally formed over the surface 144 of the dielectric material 142, sidewalls of the control gate region 150 (i.e., on sidewalls of the doped conductive material 152 and the sidewalls 156 (FIG. 1) of the metallic material 154), as well as on sidewalls and an upper surface of the capping region 160. The liner 170 may be formed of an oxide (e.g., silicon oxide), a nitride (e.g., silicon nitride), an oxynitride (e.g., silicon oxynitride), or any combination thereof. The liner 170 may be formed, for example, and without limitation, by atomic layer deposition (ALD). The liner 170 may fill a portion of the spaces 202 (FIG. 2) between the memory cell structure 100 (FIG. 1).

During subsequent processes, another patterning process may be carried out to pattern the lower materials of the intermediate structure 200 (FIG. 2), e.g., the dielectric material 142 for the charge block region 140 (FIG. 1), the conductive material 132 for the charge structure 130 (FIG. 1), and the dielectric material 122 for the tunnel dielectric region 120 (FIG. 1). Such subsequent patterning processes may include selectively removing portions of the materials by, e.g., etching.

Figure 4:
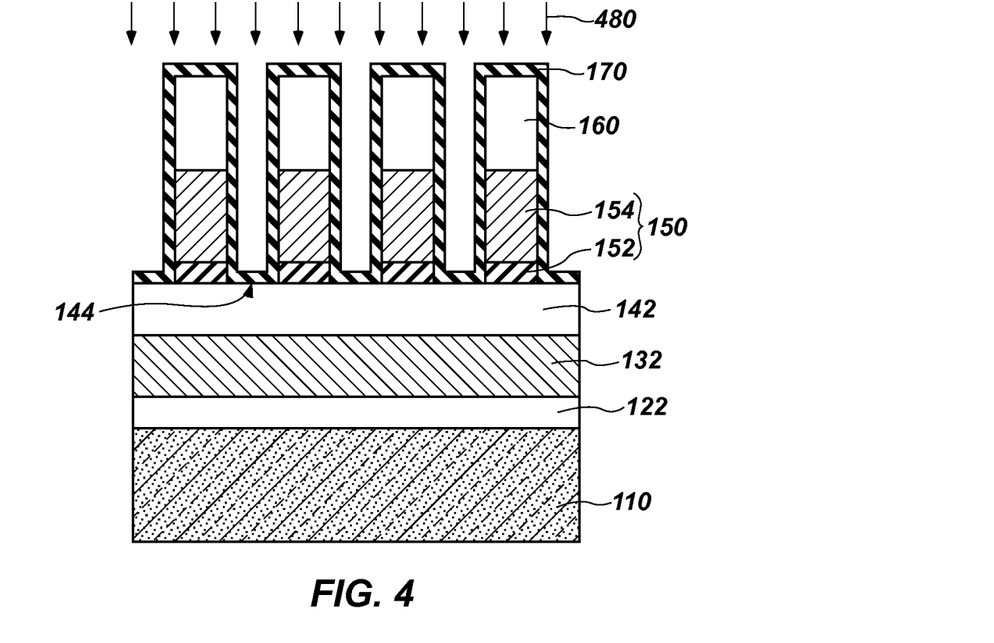
FIG. 4 is a cross-sectional, elevational, schematic illustration of a stage of processing, subsequent to that of FIG. 3, wherein the liner of FIG. 3 is exposed to a radical oxidation treatment, according to an embodiment of the present disclosure.
Figure 5:
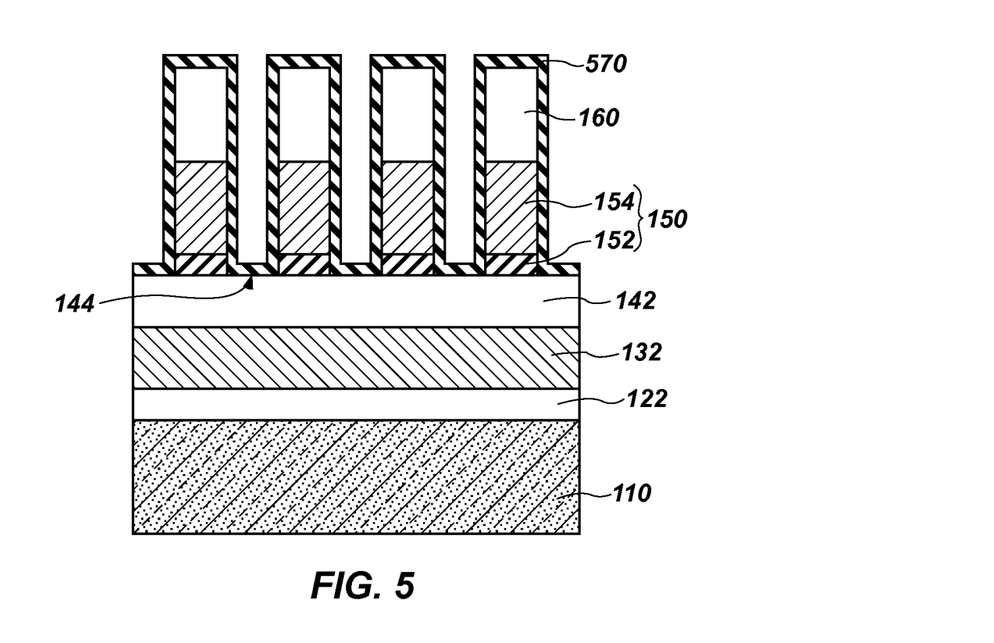
FIG. 5 is a cross-sectional, elevational, schematic illustration of a stage of processing, subsequent to that of FIG. 4, wherein a densified liner, resulting from the radical oxidation treatment of FIG. 4, overlies the intermediate structure, according to an embodiment of the present disclosure.

With reference to FIG. 4, before subsequent patterning of the lower materials of the intermediate structure 200 (FIG. 2), the liner 170 may be first exposed to a radical oxidation treatment, as indicated by arrows 480. The radical oxidation treatment may densify the liner 170 to form a densified liner 570, as illustrated in FIG. 5. The densified liner 570 may be less vulnerable (e.g., more resistant) to the corrosive chemicals (e.g., etchants) utilized during the subsequent patterning processes and may, therefore, provide improved protection for at least the metallic material 154 of the control gate region 150.

The radical oxidation treatment may include exposure of the liner 170 to heat and a gas mixture that may include oxygen radicals and hydrogen radicals. For example, and without limitation, the radical oxidation treatment may include in situ steam generation (ISSG). ISSG is conventionally an aggressive oxidation process utilized, e.g., to form oxide materials. In conventional ISSG processes, often the temperature at which the gas mixture is introduced exceeds 900° C., and the relative concentration of hydrogen to oxygen in the gas mixture is low (e.g., about 2% $H_2$ and about 98% $O_2$). As used herein, the percentages describing the composition of the gas mixture are flow rate percentages. However, according to methods of the present disclosure, the radical oxidation treatment may use a temperature (e.g., a maximum temperature) of less than about 900° C., e.g., about 600° C. to about 850° C. (e.g., about 750° C. to about 850° C.). In other embodiments of the present disclosure, the radical oxidation treatment may use a temperature of between about 600° C. and about 1200° C. (e.g., between about 600° C. and about 950° C.; between about 600° C. and 1050° C.).

The radical oxidation treatment, according to methods of the present disclosure, may also use greater concentrations of hydrogen compared to conventional ISSG treatments. For example, the radical oxidation treatment of embodiments of the present disclosure may utilize a hydrogen concentration of at least about 0.1% hydrogen ($H_2$) (e.g., between about 0.1% $H_2$ and about 99.9% $H_2$, e.g., between about 2% $H_2$ and about 50% $H_2$, e.g., between about 5% $H_2$ and about 50% $H_2$). The oxygen ($O_2$) may account for the remaining percentage of the gas mixture (e.g., between about 0.1% $O_2$ and about 99.9% $O_2$, e.g., between about 50% $O_2$ and about 98% $O_2$, e.g., between about 50% to 95%). In other embodiments, inert gases together with oxygen make up the remaining percentage of the gas mixture used in the radical oxidation treatment.

In the ISSG radical oxidation treatment, the liner 170 over the intermediate structure 200 (FIG. 2) is heated to the temperature at which the radicals are to be formed (e.g., about 600° C. to about 1050° C., e.g., about 600° C. to about 950° C., e.g., about 750° C. to about 850° C.). Then, a gas mixture comprising, consisting essentially of, or consisting of hydrogen and oxygen is introduced and exposed to the liner 170, as indicated by arrows 480 (FIG. 4). The hydrogen and oxygen are combusted and form radicals (e.g., oxygen radicals, hydrogen radicals, and, optionally, hydroxyl radicals), which radicals may react with one another. Without being limited to any particular theory, it is contemplated that the hydrogen radicals may diffuse into and through the liner 170 at a faster rate than the oxygen radicals and may, therefore, occupy dangling bonds within the liner 170 (e.g., within an oxide liner) and densify the liner 170 to form the densified liner 570 (e.g., a densified oxide liner).

The densified liner 570, with hydrogen-occupied bonds, may inhibit oxygen from passing through the liner 170 (or the formed densified liner 570 (FIG. 5)) and oxidizing and degrading the underlying metallic material 154 (e.g., tungsten). This inhibition of oxidation may occur during the radical oxidation treatment (i.e., as the liner 170 is densified, oxygen radicals from the gas mixture may be inhibited from accessing the underlying metallic material 154), during subsequent processes (e.g., during subsequent patterning processes, oxygen from etchants used may be inhibited from passing through the densified liner 570), or both such that the densified liner 570 protects the underlying metallic material 154 against degradation. Thus, unlike conventional ISSG processes in which ISSG may be utilized to aggressively oxidize a material and form an oxide material, according to the present disclosure, ISSG (or other radical oxidation treatment) is utilized to inhibit oxidation of the underlying material, i.e., the metallic material 154.

The liner 170 may be exposed to the radical oxidation treatment at the radical-forming temperature for an amount of time (referred to herein as an "exposure time") of from about two seconds (2 s) to about five minutes (5 min) (e.g., from about twelve seconds (12 s) to about thirty seconds (30 s)). During heating of the structure to the temperature at which radicals are to be formed (i.e., during a "ramp-up" period) and during cooling of the structure after the radicals exposure (i.e., during a "ramp-down" period), the structure may be exposed to only an inert gas, e.g., nitrogen. The ramp-up period and the ramp-down period may each be carried out for from about ten seconds (10 s) to about thirty seconds (30 s) (e.g., about twenty-five seconds (25 s)).

Without being limited to any one theory, it is contemplated that increasing exposure times may enable formation of thicker densified liners 570. However, it is contemplated that an exposure time may be selected to tailor the densified liner 570 to have a thickness about equal to the thickness of the liner 170 in its form prior to exposure to the radical oxidation treatment. For example, and without limitation, the liner 170, before exposure to the radical oxidation treatment, may have a thickness of about 24 Angstroms (Å), and the densified liner 570 may have a thickness of about 21 Angstroms (Å). Accordingly, the intermediate structure 200 having the densified liner 570 (FIG. 5) may have approximately the same height and width dimensions as the intermediate structure 200 (FIG. 2) covered with the liner 170 (FIG. 3) prior to the radical oxidation treatment; thus, the treatment may not substantially alter the dimensions of the liner 170 covered structure (FIG. 3). Because the dimensions may not be substantially altered, subsequent fabrication processes, such as patterning processes, may not need substantial alterations compared to those utilized to carry out conventional memory cell fabrication. For example, masks utilized in subsequent photolithographic patterning processes may be the same masks utilized in conventional processes.

The radical-forming temperature, the concentration of hydrogen (and, consequently, the concentration of oxygen), and the time at which the liner 170 is exposed to the radical oxidation treatment at the radical-forming temperature may each be selected to tailor the density of the densified liner 570 as well as the resulting thickness of the densified liner 570. It is contemplated that, for higher radical-forming temperatures, shorter exposure times may be utilized. Without being limited to any one theory, it is contemplated that, at higher radical-forming temperatures, the radical oxidation treatment may densify the liner 170 at a higher rate and, thus, the exposure time used may be shorter than that used for lower radical-forming temperatures. Also without being limited to any one theory, it is contemplated that, at higher concentrations of hydrogen, relative to oxygen in the gas mixture, the radical oxidation treatment may densify the liner 170 at a higher rate, such that a shorter exposure time may be used than used with lower concentrations of hydrogen. For example, and without limitation, in an embodiment in which the metallic material 154 consists of tungsten and the liner 170 is an oxide material (e.g., silicon oxide) formed by atomic layer deposition (ALD) over the intermediate structure 200 (FIG. 2), the radical oxidation treatment may utilize a temperature of about 750° C., a gas mixture of about 18% hydrogen ($H_2$) and about 82% oxygen ($O_2$), and an exposure time of about thirty seconds (30 s) to form the densified liner 570 of approximately the same thickness as the original liner 170. In other embodiments using the same metallic material 154, liner 170, and gas mixture composition, the temperature may be about 850° C. and the exposure time may be about twelve seconds (12 s).

Figure 6:
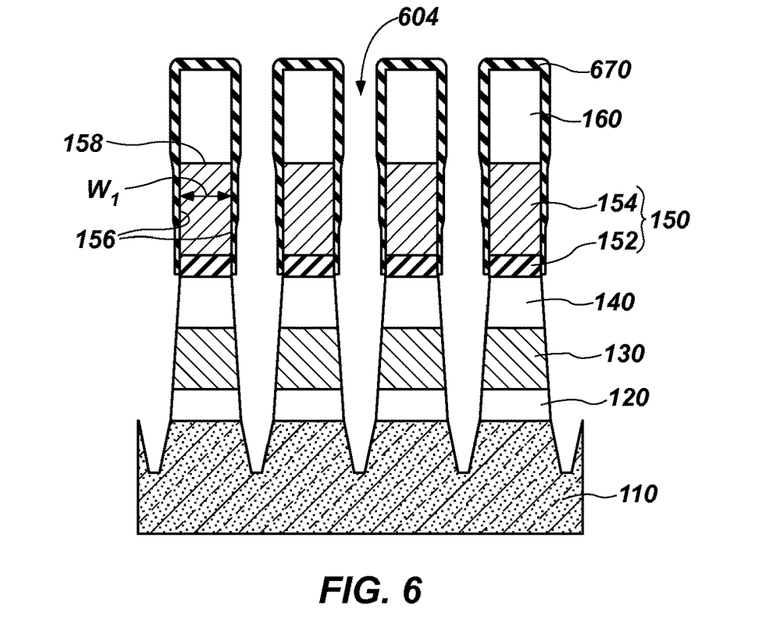
FIG. 6 is a cross-sectional, elevational, schematic illustration of a stage of processing, subsequent to that of FIG. 5, in which the structure of FIG. 5 has been subjected to a subsequent patterning process, according to an embodiment of the present disclosure.

Following formation of the densified liner 570, another patterning process (i.e., the "subsequent patterning process") may be carried out. The subsequent patterning process may selectively remove portions of the densified liner 570 (e.g., portions on the surface 144 of the dielectric material 142), portions of the dielectric material 142 (e.g., portions at the surface 144 exposed in the openings 202 (FIG. 2)), and, optionally, portions of underlying materials (e.g., portions of the conductive material 132, the dielectric material 122, and the substrate 110). As illustrated in FIG. 6, the subsequent patterning process may form the tunnel dielectric region 120, the charge structure 130, and the charge block region 140 beneath the control gate region 150.

The subsequent patterning process may be an etching process. Such etching processes and etchants therefor are well known in the art and so are not described herein in detail. It is contemplated that etchants utilized in the subsequent patterning process may be the same etchants utilized in conventional methods for patterning a structure like that illustrated in FIG. 3 to form a structure like that illustrated in FIG. 7. Therefore, the inclusion of the radical oxidation treatment in the methods of the present disclosure may not necessitate modifications to the etchants used thereafter. However, in some embodiments, the etchants utilized in the subsequent patterning processes may be formulated in light of the composition of the densified liner 570 (FIG. 5).

The subsequent patterning process may remove a portion of the densified liner 570 (FIG. 5) from sidewalls of the features of FIG. 6, leaving remnants 670 that have a reduced thickness compared to the thickness of the densified liner 570 (FIG. 5). The remnants 670 may remain on not only the capping region 160, but also on the sidewalls 156 of the metallic material 154 of the control gate region 150. Though the subsequent patterning process may remove some of the densified liner 570 (FIG. 5), the remnants 670 may nonetheless be of a denser liner material than that of the original liner 170 (FIG. 3). Trenches 604, in each of which a portion of the substrate 110 may be exposed, may separate neighboring features.

Because the densified liner 570 (FIG. 5) may not be removed fully or substantially during the subsequent patterning process, the metallic material 154 may be shielded from the corrosive chemicals (e.g., etchants) utilized during the subsequent patterning process and from metallic contamination during subsequent fabrication processes. Therefore, the metallic material 154 may not be damaged or degraded during the subsequent patterning process, and the metallic material 154 may not be contaminated. Moreover, the final width of the control gate region 150 and the metallic material 154 thereof may be substantially equal to the width $W_1$ of the control gate region 150 and the metallic material 154 thereof when initially patterned to form the intermediate structure 200 of FIG. 2.

Accordingly, disclosed is a semiconductor device structure comprising a plurality of features extending from a substrate. Neighboring features of the plurality are spaced from one another by a trench exposing a portion of the substrate. At least one feature of the plurality comprises a region of at least one conductive material over the substrate. The at least one feature of the plurality also comprises a liner on sidewalls of the region of the at least one conductive material.

The remnants 670 may thereafter be removed to form the memory cell structure 100 illustrated in FIG. 1, wherein the width $W_1$ (e.g., critical dimension) of the metallic material 154 in the memory cell structure 100 is the same as, or is at least about the same as, the width $W_1$ of the metallic material 154 in the intermediate structure 200 (FIG. 2). Therefore, the exposure of the liner 170 (FIG. 3) to the radical oxidation treatment (indicated by arrows 480 in FIG. 4) to form the densified liner 570 (FIG. 5) inhibits degradation and damage to at least the metallic material 154 during subsequent processes.

Figure 7:
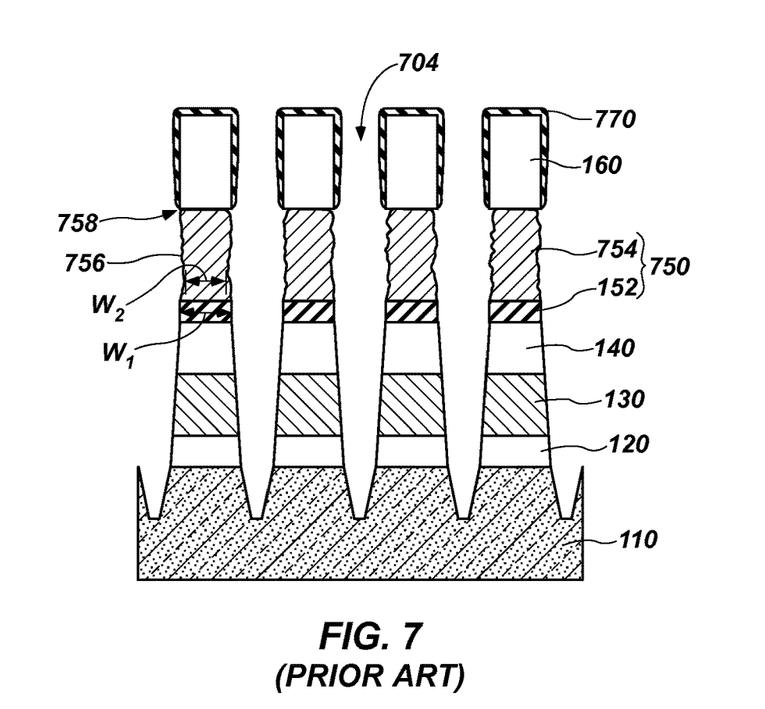
FIG. 7 is a cross-sectional, elevational, schematic illustration of a conventional stage of processing, subsequent to that of FIG. 3, wherein the structure of FIG. 3 has been subjected to a subsequent patterning process.

In contrast, in a conventional method, a liner (e.g., the liner 170 of FIG. 3) may be exposed to the subsequent patterning processes (e.g., to etchants), without a radical oxidation treatment beforehand. As illustrated in FIG. 7, the subsequent patterning process may substantially remove the liner 170 from the sidewalls 156 (FIG. 1) of the metallic material 154 (FIG. 3) and may leave only a substantially thinner remnant 770 of the liner 170 (FIG. 3) on the capping region 160, as illustrated in FIG. 7.

The substantially-thinner remnants 770 may provide substantially no masking to vertically lower materials, during the subsequent patterning process. Therefore, trenches 704 formed during the subsequent patterning process may be relatively wide. In contrast, with reference to FIG. 6, at least in embodiments of the present disclosure in which the liner 170 (FIG. 3) is formed over the capping region 160, such as a nitride capping region, and over a tungsten metallic material 154 of the control gate region 150, after the subsequent patterning process, the remnants 670 (FIG. 6) of the densified liner 570 (FIG. 5) remaining on the capping region 160 may be thicker (i.e., of a greater dimension in a direction that is normal to the lined surface of the capping region 160) than the portion of the remnants 670 remaining on the sidewalls 156 of the metallic material 154. The thicker portion of the remnants 670 on the capping region 160 may provide a masking function to underlying materials (e.g., the dielectric material 142 (FIG. 2), the conductive material 132 (FIG. 2), and the dielectric material 122 (FIG. 2) of the charge block region 140, the charge structure 130, and the tunnel dielectric region 120, respectively, to be formed during the subsequent patterning process). This masking may enable forming the trenches 604 (FIG. 6), which separate features that are to form the memory cell structures 100 (FIG. 1), at a narrower width than the trenches 704 (FIG. 7) formed by conventional methods in which the liner 170 (FIG. 3) is substantially or fully removed from the sidewalls 156.

Moreover, according to conventional methods, the consumption or degradation of the liner 170 may leave exposed much or all of the sidewalls 156 (FIG. 2) of the metallic material 154 (FIG. 2) to the etchants. Therefore, the metallic material 154 (FIG. 2) may be damaged during the subsequent patterning process if, for example, a new liner (like liner 170) is not formed. The damage to the metallic material 154 (FIG. 2) may result in a degraded control gate region 750 with a damaged metallic material region 754 with rough sidewalls 756, undercuts 758 at the interface 158 (FIG. 1) between the damaged metallic material region 754 and the capping region 160, and a reduced width $W_2$ of the damaged metallic material region 754. In contrast, the metallic material 154 (FIG. 6) of the control gate region 150 (FIG. 6), formed according to methods of the present disclosure, may have substantially smooth sidewalls 156 (FIG. 1), substantially no undercuts at the interface 158, and the final width that is substantially the same as the width $W_1$ (FIG. 2) at which the control gate region 150 was initially formed (FIG. 2).

The rough sidewalls 756 of the damaged metallic material region 754 of a structure formed using conventional methods may provide degraded (e.g., increased) capacitance between neighboring memory cells and the access lines operably connected therewith. In contrast, the metallic material 154 (FIG. 6) of the control gate region 150 (FIG. 6), formed according to methods of the present disclosure, with substantially smooth sidewalls 156 (FIG. 6), may provide relatively-low capacitance between neighboring memory cell structures 100 (FIG. 1) and the access lines operably connected therewith. For example, the capacitance between neighboring access lines (e.g., word lines) connected to memory cell structures 100 (FIG. 1) formed according to the present methods may be about 10% less than the capacitance between neighboring access lines (e.g., word lines) of memory cells formed according to conventional methods in which the liner 170 is not exposed to radical oxidation prior to subsequent patterning processes.

Moreover, the degraded control gate region 750, formed by conventional methods as illustrated in FIG. 7, may have a width $W_2$ that is less than the initial width $W_1$ of the control gate region 150 (FIG. 2) and that is less than the final width $W_1$ of the control gate region 150 (FIG. 1) formed according to embodiments of the present disclosure. The reduced width (i.e., width $W_2$) and the associated lesser amount of metallic material 154 (FIG. 3) in the damaged metallic material region 754 of the degraded control gate region 750 may lead to increased resistance in the access line (e.g., word line) operably connected to the degraded control gate region 750 and its damaged metallic material region 754. In contrast, the preserved metallic material 154 (FIG. 6) of the control gate region 150 (FIG. 6) formed according to methods of the present disclosure may provide a relatively lower resistance. For example, because the metallic material 154 is protected from degradation and damage during the subsequent patterning process by the presence of the densified liner 570 (FIG. 5) on the sidewalls 156, the resulting electrical resistance of the control gate region 150 with the preserved metallic material 154, and of an access line (e.g., a "word line") in operable connection therewith, may be substantially less, e.g., at least about 5% less (e.g., at least about 25% less, e.g., about 50% less), than the electrical resistance of the structure of FIG. 7 with its degraded control gate region 750 (FIG. 7) and damaged metallic material region 754 (FIG. 7).

Both the increased resistance and the increased structure-to-structure (e.g., word-line-to-word-line (WL-WL)) capacitance of the structure formed according to the conventional method, e.g., as illustrated in FIG. 7, leads to an increased RC time constant and, thus, a decline in performance of the memory device. In contrast, the RC time constant of memory cell structures 100 (FIG. 1) formed according to methods of the present disclosure may have a lower RC time constant than structures formed as illustrated in FIG. 7. For example, memory cells formed according to embodiments of the present disclosure may have RC time constants that are about 50% lower than the RC time constants of memory cells formed according to conventional methods in which the liner 170 (FIG. 3) is not exposed to radical oxidation before subsequent patterning processes.

Moreover, because the RC time constant of the memory cell structures 100 (FIG. 1) formed according to methods of the present disclosure are lower than those of conventionally-formed memory cells, the memory cell structures 100 may be included in a memory array utilizing longer access lines (e.g., word lines) without sacrificing the performance of the memory cell structures 100. That is, an access line with a low RC time constant may be formed to have a longer length than another access line with a high RC time constant without degrading the performance of the access line.

Accordingly, disclosed is a method of forming a memory cell, the method comprising forming a control gate region over a dielectric material and substantially conformally forming a liner on at least sidewalls of the control gate region. The liner is exposed to oxygen radicals, hydrogen radicals, and heat to form a densified liner on at least the sidewalls of the control gate region. Portions of the dielectric material are selectively removed using the densified liner to protect the sidewalls of the control gate region from exposure.

As illustrated in FIG. 1, methods of the present disclosure may be utilized to form more than one memory cell structure 100, such as an array of memory cell structures 100. Each structure of the array may be similarly formed as described above, e.g., by forming the liner 170 (FIG. 3), such as an oxide liner, on at least the sidewalls 156 (FIG. 1) of at least one conductive material (e.g., the metallic material 154) of the control gate region 150, exposing the liner 170 to a radical oxidation treatment (e.g., ISSG) to densify the liner 170 before a subsequent patterning process (e.g., etching), which may be carried out without exposing the sidewalls 156 of the at least one conductive material at least because the densified liner 570 (FIG. 5) may be more resistant to the corrosive materials (e.g., etchants) of the subsequent patterning process.

Thus, a method of forming an array of memory cells is disclosed. The method comprises forming features comprising at least one conductive material on a dielectric material exposed between the features. An oxide liner is formed on sidewalls of the features and on the dielectric material. The oxide liner is exposed to an in situ steam generation (ISSG) process to form a densified oxide liner on the sidewalls of the features. A portion of the dielectric material is removed, and exposure of the at least one conductive material is prevented with the densified oxide liner.

Though it is contemplated that the above-described methods are well suited for formation of memory cells (e.g., the memory cell structures 100 of FIG. 1), the methods may also be utilized when fabricating other semiconductor device structures that include conductive regions formed prior to subsequent patterning processes. For example, the methods may be utilized to protect conductive material of other memory structures (e.g., dynamic random access memory (DRAM) structures), of access lines (e.g., word lines), of digit lines (e.g., bit lines), and of other components of semiconductor devices. In such embodiments, a method of forming a semiconductor device structure comprises forming a liner on a conductive material on a base material. The liner is exposed to a radical oxidation treatment to form a densified liner on the conductive material. The base material is patterned while the conductive material is protected from patterning with the densified liner.

While the present disclosure is susceptible to various modifications and alternative forms in implementation thereof, specific embodiments have been shown by way of example in the drawings and have been described in detail herein. However, the present disclosure is not intended to be limited to the particular forms disclosed. Rather, the present disclosure encompasses all modifications, combinations, equivalents, variations, and alternatives falling within the scope of the present disclosure as defined by the following appended claims and their legal equivalents.

What is claimed is:

1. A semiconductor device, comprising:
features extending from a material, neighboring features spaced from one another, at least one feature of the features comprising:
a tunnel dielectric material over the material;
a conductive material over the tunnel dielectric material;
a charge block material over the conductive material;
a region of at least one other conductive material over the material;
a capping material over the region of at least one other conductive material; and
a liner directly on sidewalls of the region of at least one other conductive material and directly on sidewalk and a top surface of the capping material, the liner not on sidewalls of the tunnel dielectric material, the conductive material, and the charge block material, a greater thickness of the liner on the sidewalk of the capping material than a thickness of the liner on the sidewalls of the at least one other conductive material, and the liner comprising hydrogen and at least one of an oxide, a nitride, or an oxynitride.

2. The semiconductor device of claim 1, wherein a portion of the liner is directly on the sidewalls of the region of at least one other conductive material and another portion of the liner is directly on the sidewalls of the capping material over the region of the at least one other conductive material.

3. The semiconductor device of claim 2, wherein a distance between neighboring features is smaller between laterally adjacent another portions of the liner directly on the sidewalls of the capping material than between laterally adjacent portions of the liner directly on the sidewalk of the region of the at least one other conductive material.

4. The semiconductor device of claim 1, wherein the liner comprises a densified liner.

5. The semiconductor device of claim 1, wherein the liner comprises at least one of silicon oxide, silicon nitride, or silicon oxynitride.

6. The semiconductor device of claim 1, wherein:
the region of at least one conductive material comprises a region of tungsten; and
the liner comprises the oxide, the oxide comprising silicon oxide.

7. A semiconductor device, comprising:
memory cell structures, at least one memory cell structure of the memory cell structures comprising:
a control gate region comprising a metallic material;
a capping region overlying the control gate region, sidewalls of the control gate region substantially aligned with sidewalls of the capping region, wherein the capping region defines a width substantially equal to a width defined by the control gate region; and a liner directly on the capping region and directly on the sidewalls of the control gate region, the liner comprising hydrogen and at least one of an oxide, a nitride, or an oxynitride; and a charge structure under the control gate region, the liner Trot on sidewalk of the charge structure.

8. The semiconductor device of claim 7, wherein the metallic material consists of an elemental metal.

9. The semiconductor device of claim 7, wherein the control gate region comprises at least one region of the metallic material and at least one region of a doped conductive material.

10. The semiconductor device of claim 9, wherein the doped conductive material comprises conductive doped polysilicon.

11. The semiconductor device of claim 9, wherein the at least one region of the metallic material is over the at least one region of the doped conductive material.

12. The semiconductor device of claim 7, wherein the charge structure defines a wider width than the width defined by the control gate region.

13. The semiconductor device of claim 7, wherein:
sidewalls of the control gate region are perpendicular to a surface of a material supporting the memory cell structures; and
sidewalk of the charge structure are angled relative to the surface of the material.

14. The semiconductor device of claim 7, further comprising:
a charge block region between the charge structure and the control gate region; and
a tunnel dielectric region between the charge structure and a material supporting the memory cell structures.

15. The semiconductor device of claim 14, wherein:
the charge block region comprises a dielectric material; and
the tunnel dielectric region comprises silicon dioxide.

16. A semiconductor device comprising an array of memory cell structures, a memory cell structure of the array of memory cell structures comprising:
a control gate region electrically isolated from an underlying charge structure by a region of a dielectric material;
another region of another dielectric material underlying the charge structure and overlying a material;
a capping region over the control gate region; and
a liner directly on sidewalk of the control gate region and directly on sidewalls and an upper surface of the capping region, the liner comprising hydrogen and at least one of an oxide, a nitride, or an oxynitride, the liner not on sidewalls of the charge structure,
the memory cell structure defining a tapering width along a sidewall of the memory cell structure from the material toward the region of the dielectric material underlying the control gate region, and
the memory cell structure defining a substantially consistent width along the sidewall of the memory cell structure from the control gate region to an upper surface of the capping region, the capping region located directly over the control gate region.

17. The semiconductor device of claim 16, wherein the sidewall of the memory cell structure is substantially smooth at least from the control gate region to the upper surface of the capping region.

18. The semiconductor device of claim 16, wherein:
the control gate region comprises:
a doped conductive material over the region of the dielectric material; and a metallic material over the doped conductive material; and
the control gate region defines the substantially consistent width along the doped conductive material and the metallic material.

19. A semiconductor device, comprising:
features extending from a material, neighboring features spaced from one another, at least one feature of the features comprising:
a tunnel dielectric material over the material;
a conductive material over the tunnel dielectric material;
a charge block material over the conductive material;
a region of at least one other conductive material over the material;
a capping material over the region of at least one other conductive material; and
a liner directly on sidewalls of the region of at least one other conductive material and directly on sidewalls of the capping material, the liner not on sidewalls of the tunnel dielectric material, the conductive material, and the charge block material, the liner comprising hydrogen and at least one of an oxide, a nitride, or an oxynitride, and a thickness of the liner directly on the sidewalls of the capping material greater than a thickness of the liner directly on the sidewalk of the region of at least one other conductive material.

* * * * *

UNITED STATES PATENT AND TRADEMARK OFFICE
CERTIFICATE OF CORRECTION

PATENT NO. : 11,355,607 B2
APPLICATION NO. : 14/875493
DATED : June 7, 2022
INVENTOR(S) : Christopher J. Larsen et al.

It is certified that error appears in the above-identified patent and that said Letters Patent is hereby corrected as shown below:

In the Claims

| | | | |
|---|---|---|---|
| Claim 1, | Column 14, | Line 28, | change "sidewalk" to --sidewalls-- |
| Claim 1, | Column 14, | Line 32, | change "sidewalk" to --sidewalls-- |
| Claim 3, | Column 14, | Line 46, | change "sidewalk" to --sidewalls-- |
| Claim 7, | Column 15, | Line 6, | change "Trot on sidewalk" to --not on sidewalls-- |
| Claim 13, | Column 15, | Line 26, | change "sidewalk" to --sidewalls-- |
| Claim 16, | Column 15, | Line 47, | change "sidewalk" to --sidewalls-- |
| Claim 19, | Column 16, | Line 46, | change "sidewalk" to --sidewalls-- |

Signed and Sealed this
Thirty-first Day of January, 2023

Katherine Kelly Vidal
*Director of the United States Patent and Trademark Office*